US007530425B2

(12) United States Patent
Whitaker

(10) Patent No.: US 7,530,425 B2
(45) Date of Patent: May 12, 2009

(54) SPEAKER ENCLOSURE FOR A CEILING OR WALL MOUNTED SPEAKER METHOD AND APPARATUS

(76) Inventor: Scott R. Whitaker, 5550 Lindenwood La., Fairfield, OH (US) 45014

( * ) Notice: Subject to any disclaimer, the term of this patent is extended or adjusted under 35 U.S.C. 154(b) by 385 days.

(21) Appl. No.: 11/448,691

(22) Filed: Jun. 8, 2006

(65) Prior Publication Data

US 2007/0284183 A1 Dec. 13, 2007

(51) Int. Cl.
*H05K 5/00* (2006.01)

(52) U.S. Cl. ...................... 181/151; 181/150; 181/148; 181/178

(58) Field of Classification Search ................. 181/151, 181/150, 148, 178
See application file for complete search history.

(56) References Cited

U.S. PATENT DOCUMENTS 811,900 A * 2/1906 Brown ........................ 181/178
1,568,521 A * 1/1926 Midence ..................... 181/178
1,920,631 A * 8/1933 Coumbopoulos ............ 369/81
2,012,538 A * 8/1935 Krohn ........................ 181/178
2,577,528 A * 12/1951 Kennedy .................... 312/7.1
2,744,584 A 5/1956 Hellon
2,821,260 A 1/1958 Shaffer
3,804,195 A * 4/1974 Everitt et al. ................ 181/148
3,872,235 A * 3/1975 Manly, Jr. ................... 174/359
4,139,076 A * 2/1979 Hruby, Jr. ................... 181/151
4,167,985 A * 9/1979 Dunlavy ..................... 181/148
4,296,280 A 10/1981 Richie
4,640,381 A * 2/1987 Tsuchiya et al. ............ 181/144
4,703,829 A * 11/1987 Hardt ......................... 181/178
4,805,728 A * 2/1989 Carter et al. ................ 181/141
4,903,300 A 2/1990 Polk
4,924,964 A * 5/1990 Olsen ......................... 181/151
4,964,482 A * 10/1990 Meyer ........................ 181/146
5,082,083 A 1/1992 Draffen
5,194,701 A * 3/1993 Yamada-Scriba ........... 181/151
5,206,464 A * 4/1993 Lamm et al. ................ 181/150
5,306,880 A * 4/1994 Coziar et al. ................ 181/149
5,324,896 A * 6/1994 Magnani ..................... 181/144
5,359,158 A 10/1994 Queen
5,393,940 A * 2/1995 Bedard et al. ............... 181/210
5,731,553 A * 3/1998 Ledoux ...................... 181/156
5,979,591 A * 11/1999 Harrison ..................... 181/199
6,098,743 A 8/2000 McGrath
6,135,551 A * 10/2000 Linder ..................... 297/217.4
6,243,262 B1 * 6/2001 Koo et al. ................... 361/687
6,367,579 B1 * 4/2002 Wiener ....................... 181/199
6,494,289 B1 * 12/2002 Bachmann et al. .......... 181/173
6,550,570 B2 4/2003 Combest
6,609,589 B2 8/2003 Combest (Continued)

*Primary Examiner*—Jeffrey Donels
*Assistant Examiner*—Forrest M Phillips
(74) *Attorney, Agent, or Firm*—William M. Hobby, III

(57) ABSTRACT

A method of mounting a speaker enclosure for a ceiling or wall mounted speaker which includes the selection of a flexible polymer speaker housing forming a hollow chamber having a speaker opening therein and being collapsible to a smaller size. A hole is cut into a building, ceiling or interior wall and a selected speaker housing is collapsed to a size to fit through the speaker opening in one side of a ceiling or wall. The collapsed flexible polymer speaker housing is then expanded on the other side of the ceiling or wall and attached to the ceiling or wall with an adhesive or the like adjacent the opening and a speaker attached to the ceiling or wall opening.

12 Claims, 3 Drawing Sheets

U.S. PATENT DOCUMENTS

| | | | | |
|---|---|---|---|---|
| 6,687,380 | B1 | 2/2004 | Vishwamitra | |
| 6,735,321 | B2 | 5/2004 | Mazejka et al. | |
| 6,758,451 | B2 * | 7/2004 | Rivera et al. | 248/231.9 |
| 6,870,943 | B2 | 3/2005 | Liu | |
| 7,116,795 | B2 * | 10/2006 | Tuason et al. | 381/386 |
| 7,207,413 | B2 * | 4/2007 | Plummer | 181/199 |
| 7,337,874 | B1 * | 3/2008 | Ritto | 181/199 |
| 2002/0074184 | A1 * | 6/2002 | Cowgill et al. | 181/178 |
| 2003/0196851 | A1 * | 10/2003 | Cowgill et al. | 181/178 |
| 2006/0266579 | A1 * | 11/2006 | Stern et al. | 181/178 |
| 2006/0272885 | A1 * | 12/2006 | Lee | 181/199 |
| 2007/0029131 | A1 * | 2/2007 | Pan et al. | 181/148 |

* cited by examiner

SPEAKER ENCLOSURE FOR A CEILING OR WALL MOUNTED SPEAKER METHOD AND APPARATUS

BACKGROUND OF THE INVENTION

The present invention relates to a method of mounting a speaker enclosure for a ceiling or wall mounted speaker and to the speaker enclosure having a flexible polymer speaker housing collapsible into a smaller size for insertion through a ceiling or wall opening for expanding on the other side thereof.

Typical building walls, such as in homes, commonly have in-wall or in-ceiling speakers prewired and mounted in the wall of the building to provide improved fidelity from a high-fidelity sound system or from a home entertainment system including providing surround sound for television sets and the like. Most modern stereo and high fidelity sound home entertainment systems, including television sets, come equipped with connections for the connection of a remote pair of speakers. The connection is provided to allow the operation of an additional pair of stereo speakers in a different room of the building or in the same room as the principal speakers. It has been common to prewire homes for mounting in-wall or ceiling speakers. The installation of the speakers is in the nominal spacing between adjacent wall studs or ceiling joists of a home where the depth of a speaker enclosure for a wall can be no greater than the width of a standard 2×4" wall stud in which the exterior surfaces of the wall are flush with the studs. This provides a very limited space for the mounting of a speaker. The wide variety of such speakers have been provided in the past and are specifically designed to be mounted through one side of the wall or through the ceiling by cutting an opening in the wall or ceiling, such as through a dry wall panel, and attaching the speaker therein flush with the wall or ceiling so that a decorative grill can be mounted over the speaker.

Typically, the speaker is mounted through one side of a dry wall panel in a wall or ceiling and between the standard 2×4" wall studs or ceiling joists. Wall studs or ceiling joists are typically spaced 16" on center. Most speakers use the entire inside of a wall between the pair of studs or joists where the speaker is mounted as a speaker enclosure to handle the backwave of the speaker which is usually an elongated narrow box formed of drywall attached to building studs. This enclosure for the speaker is somewhat inadequate in dealing with the speaker's woofer portion and in absorbing the backwave or damping the vibrations from the speaker.

It is accordingly an object of the present invention to provide a lightweight speaker enclosure that can be added to an existing in-wall or in-ceiling mounted speaker without any destruction or damaging of the existing wall and which dampens vibration and absorbs the sound energy eminating from the rear of the speaker mounted in the wall. The speaker enclosure is easily retrofitted in a wall and reduces noise from the wall.

Prior U.S. patents which have attempted to form an enclosure in a wall for a wall speaker include U.S. Pat. Nos. 6,609,589 and 6,550,570 to Combest for a speaker enclosure and mounting method for isolating and insulating a faceplate and heavy speakers from surrounding mounting surfaces. This system, in essence, removes a fairly large-section of a dry wall between a pair of studs for attaching the speakers and a recessed speaker box. In the U.S. Pat. No. 4,296,280 to Richie, a wall mounted speaker system operates in a similar manner to the Combest patents in that a large opening is cut into one side of a wall between the wall studs for mounting the speakers and a speaker enclosure. In the J. B. Hellon U.S. Pat. No. 2,744,584, a public address housing assembly is provided for loudspeakers and incorporates the assemblies in a wall or a ceiling of a building to provide an installation substantially flush with the supporting wall or ceiling. The E. E. Shaffer U.S. Pat. No. 2,821,260 shows a built-in sound system for a home in which a speaker box is mounted through a panel of the wall for attaching a speaker thereto. The Tsuchiya et al. U.S. Pat. No. 4,640,381 is a wall mounted resin speaker cabinet while the Draffen U.S. Pat. No. 5,082,083 is a structure wall mounted speaker assembly.

In the Vishwamitra U.S. Pat. No. 6,687,380 an active subwoofer speaker system is provided for an in-wall construction. In the Polk U.S. Pat. No. 4,903,300 a sub-woofer system and method for installation in a structural partition is provided for a loudspeaker system which is installed in a space between a front panel and an enclosed area behind the front panel of a partition wall or ceiling. The Liu U.S. Pat. No. 6,870,943 is for a ceiling loudspeaker with means for installing the loudspeaker on the ceiling in position. The U.S. Pat. No. 6,098,743 to McGrath is for an acoustical speaker housing and method of installation. The Queen U.S. Pat. No. 5,359,158 is for a ceiling mounted loudspeaker which has upper and lower sound directing structures having walls acting as a radial horn. The Mazejka et al. U.S. Pat. No. 6,735,321 is a loudspeaker enclosure mounting above the listener.

These prior wall and ceiling mounted speaker enclosures typically require cutting a very large opening in a wall in order to mount the speaker enclosure or premounting the speaker enclosure during the construction of the wall.

In contrast, the present invention has a single speaker housing for handling the backwave of a wall or ceiling mounted speaker and which is lightweight, flexible and collapsible to a smaller size for inserting through an existing speaker opening and then expanded on the other side of the wall or ceiling and which can be readily attached to the wall or ceiling for mounting the speaker. The flexible housing also includes flexible acoustic damping materials, such as an acoustic foam, to further damp the backwave of a speaker.

SUMMARY OF THE INVENTION

A method of mounting a speaker enclosure for a ceiling or wall mounted speaker includes the selection of a flexible polymer speaker housing forming a hollow chamber having a speaker opening therein and being collapsible into a smaller size. A hole is cut into a building ceiling or interior wall and a selected speaker housing is collapsed to a size to fit through the speaker opening in one side of a ceiling or wall. The collapsed flexible polymer speaker housing is then expanded on the other side of the ceiling or wall and can optionally be attached to the ceiling or wall with an adhesive or the like adjacent the opening. A speaker is then attached to the ceiling or wall through the speaker opening in the flexible polymer speaker housing. The flexible polymer speaker housing may include a flexible sound absorbent material lining and a portion of the flexible sound absorbent material may be isolated with flexible barrier walls.

A speaker housing apparatus is the same as selected in the method and includes a flexible polymer speaker housing forming a hollow chamber and having a speaker opening therein and being collapsible into a smaller size and includes a flexible sound absorbent material lining a portion of the chamber and being collapsible with the speaker housing. The flexible polymer speaker housing may have a flexible barrier wall therein sandwiching flexible sound absorbent material between the polymer housing and the barrier wall.

BRIEF DESCRIPTION OF THE DRAWINGS

Other objects, features, and advantages of the present invention will be apparent from the written description and the drawings in which.

DETAILED DESCRIPTION OF THE PREFERRED EMBODIMENT

Figure 1:
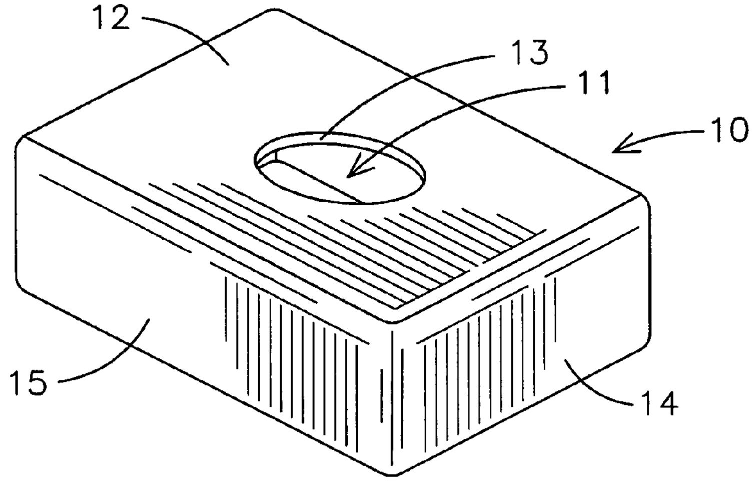
FIG. 1 is a perspective view of a flexible speaker housing.
Figure 2:
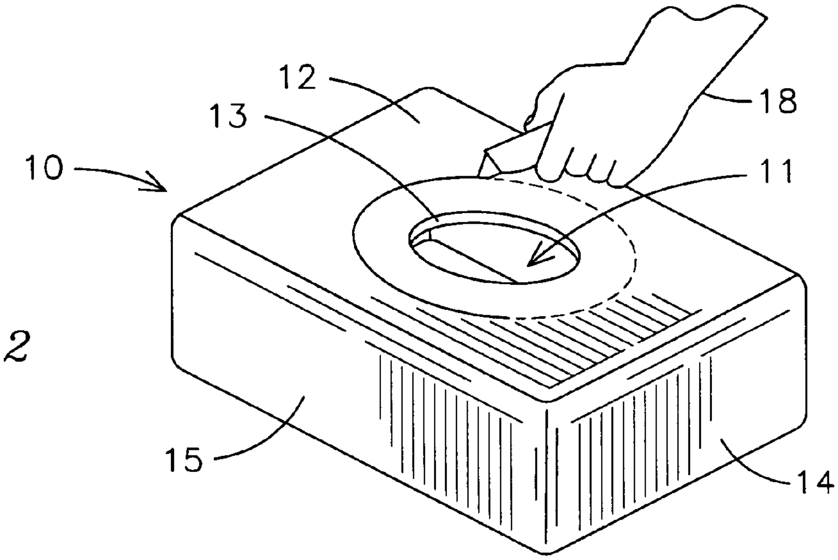
FIG. 2 is a perspective view of the speaker housing of FIG. 1 having the opening into the housing chamber being widened for a particular size speaker.
Figure 3:
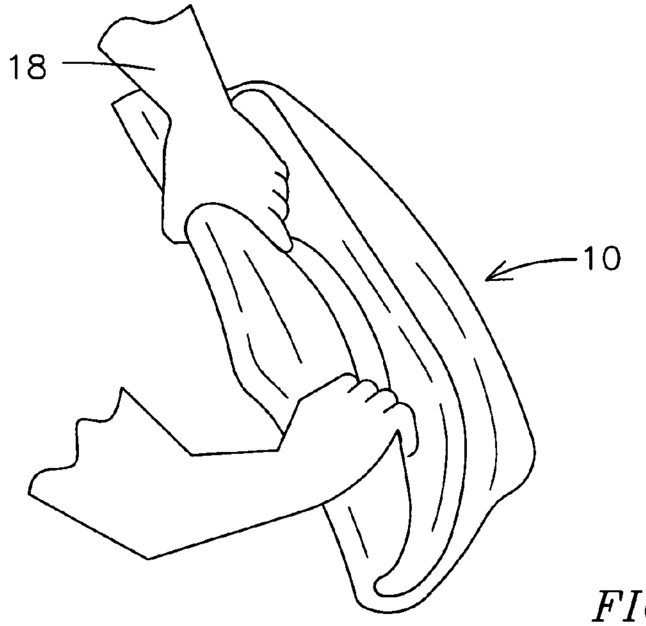
FIG. 3 is a perspective view of the speaker housing of FIGS. 1 and 2 being collapsed and folded for insertion into a wall or ceiling opening.
Figure 4:
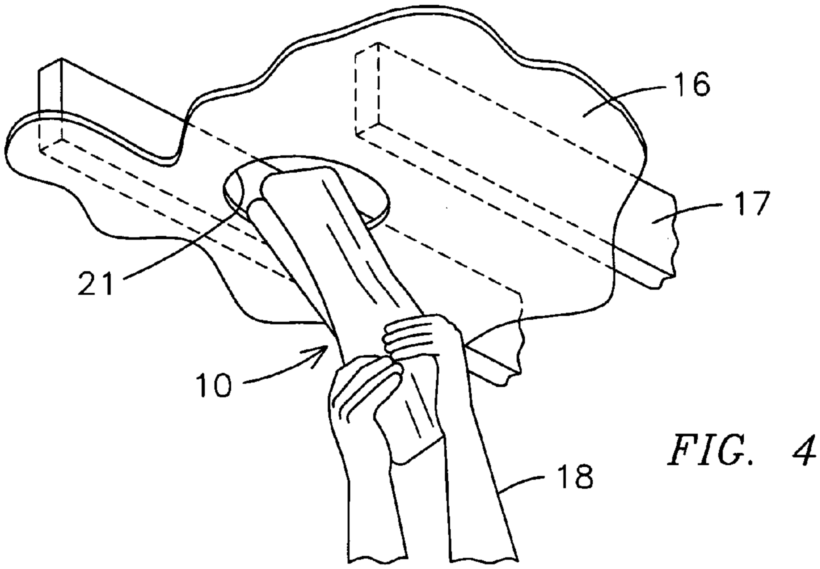
FIG. 4 is a cutaway perspective view of the folded speaker housing of FIG. 3 being inserted into a ceiling speaker opening.

Referring to the drawings FIGS. 1-8, a method of installing an in-wall or in-ceiling speaker enclosure 10 is illustrated in which the speaker enclosure 10 is illustrated in FIG. 1 as a flexible and collapsible speaker enclosure housing which may be made of a flexible polymer material, such as rubber or butyl rubber or polyvinyl chloride (PVC), and has an interior chamber 11 through a top wall 12 which has a speaker opening 13 thereinto. The flexible housing 10 has end walls 14 and sidewalls 15 and may be sized to fit into a standard wall which has a plurality of vertically extending studs, such as 2×4 wooden studs or for placement through a ceiling 16, which may be a drywall or acoustic type ceiling mounted to ceiling joists 17, as seen in FIG. 4. The flexible speaker housing 10 has a person's hand 18 holding a knife 20 and enlarging the hole 13 to fit a particular speaker and speaker opening in the wall or ceiling. Once the hole 13 is sized in FIG. 2, the flexible speaker housing 10 is collapsed, as seen in FIG. 3, by folding or rolling up or otherwise collapsing the flexible speaker housing 10 for insertion through a speaker opening 21 cut in the ceiling or wall panel 16 between the joists or studs 17.

Figure 5:
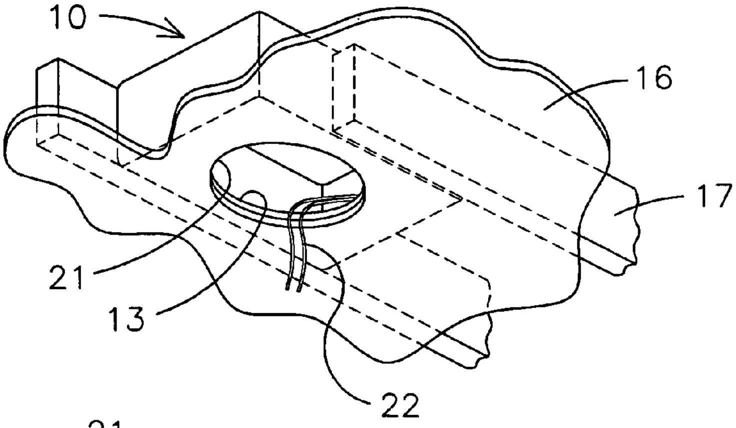
FIG. 5 is a perspective view of the speaker housing expanded on the other side of the ceiling or wall.
Figure 6:
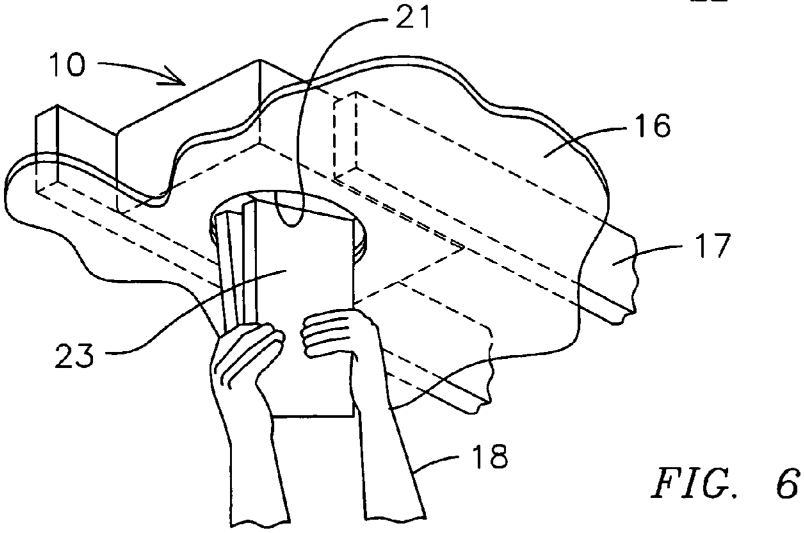
FIG. 6 is a cutaway perspective view of acoustic foam being inserted into the speaker housing.

Once the lightweight, flexible and collapsible speaker housing 10 has been inserted through the opening 21, it is then expanded, as seen in FIG. 5, and the speaker wires 22 can be pulled beneath the speaker housing 10, top wall 12 to extend out the opening 21. The flexible speaker housing 10 is shown as fitting directly between the ceiling joists 17. A sound damping material, such as an acoustic foam 23 which may be a polyurethane foam, is then inserted through the opening 21 and through the opening 13 of the speaker housing into the flexible speaker housing to add additional rearwave speaker dampening. The speaker housing 10 is then attached to the wall panel 16 with an adhesive 24 or by any other means desirable.

Figure 7:
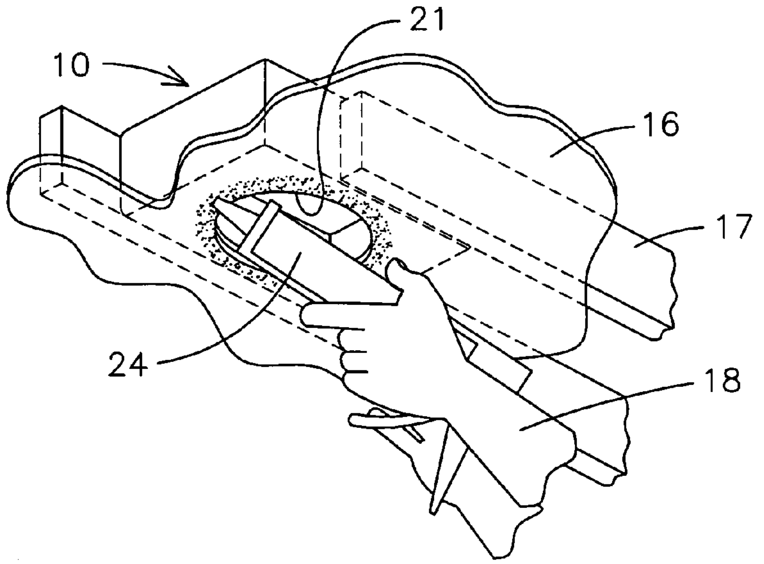
FIG. 7 is a cutaway perspective view of a person applying an adhesive between the ceiling or wall surface and the speaker housing for attaching the speaker housing to the ceiling or wall.
Figure 8:
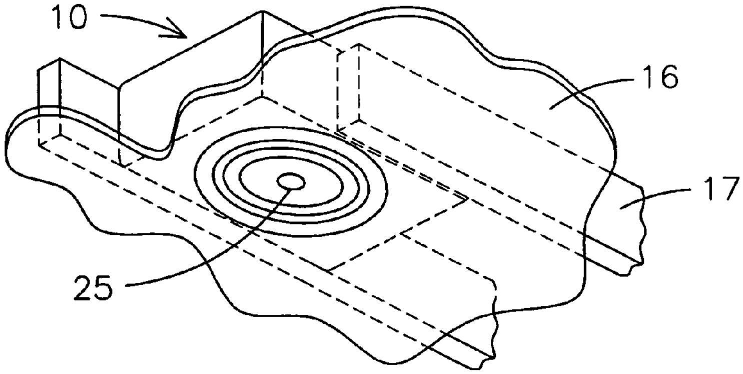
FIG. 8 is a cutaway perspective of a speaker mounted in the ceiling or wall opening and extending into the speaker housing.

FIG. 7 is the optional step of applying an adhesive 24 between the speaker housing 10, top wall 12 and the wall or ceiling panel 16 adjacent the opening 21 of the panel 16 and the opening 13 of the speaker housing. Once the adhesive is cured, a speaker, such as an electrodynamic speaker 25, is attached to the panel 16 while extending through the speaker housing 10. Opening 13 may also be attached to the speaker housing 10.

Figure 9:
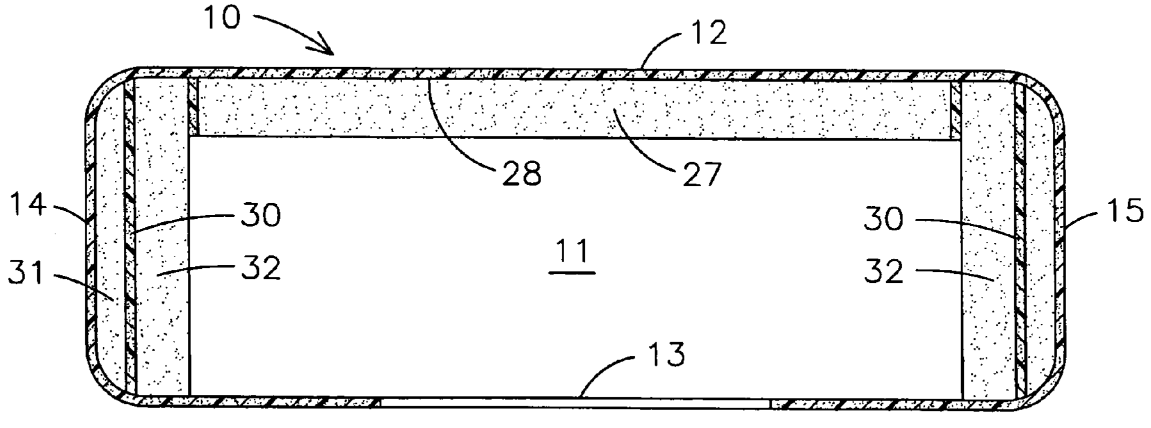
FIG. 9 is a sectional view of the speaker housing of FIGS. 1-8.

Turning now to FIG. 9, a speaker housing 10 is formed of a flexible and collapsible wall 26 forming the chamber 11 therein having the opening 13 thereinto. The chamber may have acoustic foam 27, such as a flexile polyurethane foam, lining the flexible bottom wall 28. The acoustic foam 27 is also be flexible and collapsible along with the speaker housing 10. A flexible vinyl barrier 30 may also be formed around the sidewalls around the entire perimeter of the speaker housing 10 interior chamber 11 and may have acoustic foam 31 mounted inside the barrier 30 between the barrier 30 and the sidewalls 14 and 15. Acoustic foam 32 is mounted around the perimeter of the speaker housing 10 and attached to the barrier 30 so as to sandwich the barrier 30 between the acoustic foam 31 and 32. The barrier 30 as well as the acoustic foam 31 and 32 and 27 are all made of a flexible material which can be collapsed with the collapsible housing 10 and inserted through a speaker opening in a wall or ceiling to form a damping speaker enclosure for the rearwave of the speaker. In addition to the dampening acoustic foam, the rearwave is also dampened by the flexible housing 10 which is slightly flexible to the rearwave.

It should be clear at this time that a method and apparatus for mounting a speaker enclosure for a ceiling or wall mounted speaker has been provided which advantageously can be attached to an existing wall or ceiling. The flexible polymer speaker housing has a hollow chamber lined with flexible acoustic foam which can be collapsed and inserted through an existing hole in a building ceiling or interior wall and then expanded which simplifies the mounting of a speaker housing and providing better speaker rearwave damping, reducing vibrations and distortion from the speaker. However, the present invention is not to be construed as limited to the forms shown which are to be considered illustrative rather then restrictive.

I claim:

1. A method of mounting a speaker enclosure for a ceiling or wall mounted speaker comprising the steps of:

- selecting a flexible polymer speaker housing forming a hollow chamber having a speaker opening therein and being collapsible into a smaller size;
- cutting a hole into a building ceiling or interior wall;
- collapsing said selected flexible polymer speaker housing to a size to fit through said speaker opening in one side of a ceiling or wall;
- enlarging said flexible hollow speaker housing speaker opening to fit the opening cut into the building ceiling or wall
- expanding said collapsed flexible polymer speaker housing on the other side of the ceiling or wall;
- adhesively attaching said flexible hollow speaker housing to said ceiling or wall adjacent said opening in said ceiling or wall; and
- attaching a speaker to said ceiling or wall opening through said speaker opening in said flexible polymer speaker housing.

2. The method of mounting a speaker enclosure for a ceiling or wall mounted speaker in accordance with claim 1 in which the step of selecting a speaker housing includes selecting a speaker housing having a flexible sound absorbent material lining a portion of said chamber and being collapsible with said speaker housing.

3. The method of mounting a speaker enclosure for a ceiling or wall mounted speaker in accordance with claim 2 in which the step of collapsing said speaker housing includes folding said speaker housing to a size to fit through said opening cut in said ceiling or wall.

4. The method of mounting a speaker enclosure for a ceiling or wall mounted speaker in accordance with claim 2 in which the step of selecting a speaker housing includes selecting a flexible hollow speaker housing having at least one flexible barrier wall inside said chamber sandwiching flexible sound absorbent material between said flexible polymer housing and said barrier wall.

5. The method of mounting a speaker enclosure for a ceiling or wall mounted speaker in accordance with claim 4 in which the step of selecting a speaker housing includes selecting a flexible hollow speaker housing having a pair of flexible barrier walls thereinside sandwiching flexible sound absorbent material between said polymer housing and said barrier wall.

6. The method of mounting a speaker enclosure for a ceiling or wall mounted speaker in accordance with claim 1 including the step of inserting at least one piece of acoustic absorbent material through said ceiling or wall opening into said chamber of said flexible speaker housing.

7. The method of mounting a speaker enclosure for a ceiling or wall mounted speaker in accordance with claim 1 including the step of mounting a speaker to said ceiling or wall through said opening in said ceiling or wall.

8. The method of mounting a speaker enclosure for a ceiling or wall mounted speaker in accordance with claim 2 in which the step of selecting a flexible housing includes selecting a flexible PVC housing.

9. The method of mounting a speaker enclosure for a ceiling or wall mounted speaker in accordance with claim 8 in which the step of selecting a sound absorbent material includes selecting an acoustic polyurethane foam.

10. A speaker enclosure for a ceiling or wall mounted speaker comprising:

a flexible polymer speaker housing forming a hollow chamber having a speaker opening therein and being collapsible into a smaller size;

a flexible sound absorbent material lining a portion of said chamber and being collapsible with said speaker housing; and a pair of flexible barrier walls thereinside sandwiching said flexible sound absorbent material between said polymer housing and said barrier wall;

whereby a speaker enclosure for a ceiling or wall is collapsible to fit through a speaker opening in one side of a ceiling or wall and expandable on the other side of the ceiling or wall for attaching a speaker through said speaker opening.

11. The speaker enclosure for a ceiling or wall mounted speaker in accordance with claim 10 in which sound absorbent material is an acoustic polyurethane foam.

12. The speaker enclosure for a ceiling or wall mounted speaker in accordance with claim 11 in which flexible polymer housing is formed of a flexible butyl rubber.

* * * * *